(12) United States Patent
Kim et al.

(10) Patent No.: US 7,940,576 B2
(45) Date of Patent: May 10, 2011

(54) SEMICONDUCTOR DEVICE

(75) Inventors: Bo-Kyeom Kim, Gyeonggi-do (KR); Sang-Sic Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 335 days.

(21) Appl. No.: 12/323,687

(22) Filed: Nov. 26, 2008

(65) Prior Publication Data

US 2009/0273990 A1   Nov. 5, 2009

(30) Foreign Application Priority Data

Apr. 30, 2008   (KR) .................. 10-2008-0040930

(51) Int. Cl.
*G11C 7/10*   (2006.01)
(52) U.S. Cl. .................. 365/189.05; 365/189.17
(58) Field of Classification Search ............. 365/189.05, 365/189.17, 230.05, 230.03
See application file for complete search history.

(56) References Cited

U.S. PATENT DOCUMENTS

| 5,771,199 | A | 6/1998 | Lee |
| 6,310,816 | B2 | 10/2001 | Manning |
| 6,414,868 | B1 | 7/2002 | Wong et al. |
| 2004/0032776 | A1 | 2/2004 | Kim et al. |
| 2005/0276146 | A1 * | 12/2005 | Ha et al. .................. 365/230.03 |
| 2006/0018168 | A1 | 1/2006 | Kim |
| 2008/0201548 | A1 * | 8/2008 | Przybylski et al. .......... 711/171 |

FOREIGN PATENT DOCUMENTS

| JP | 2003-143240 | 5/2003 |
| JP | 2005-056529 | 3/2005 |
| JP | 2005-317124 | 11/2005 |
| KR | 100550643 | 2/2006 |

OTHER PUBLICATIONS

Notice of Preliminary Rejection issued from Korean Intellectual Property Office on Feb. 11, 2011.

* cited by examiner

*Primary Examiner* — Vu A Le
(74) *Attorney, Agent, or Firm* — IP & T Group LLP

(57) ABSTRACT

There is provided a semiconductor memory device, including: a plurality of bank groups each comprising a plurality of banks; a plurality of data pads grouped by a predetermined number for receiving data for the bank groups, wherein the data pads are divided into a plurality of first pad groups receiving data and a plurality of second pad groups selectively receiving data according to a data input/output option value; a first driving unit configured to drive data input via the first pad group to transfer the data input via the first pad group to the bank group corresponding to the first pad group; a second driving unit configured to drive data input via the second pad group to transfer the data input via the second pad group to the bank group corresponding to the second pad group; and a third driving unit configured to drive data input via the first pad group to transfer the data input via the first pad group to the bank group corresponding to the second pad group in response to the data input/output option value.

14 Claims, 8 Drawing Sheets

US 7,940,576 B2

SEMICONDUCTOR DEVICE

CROSS-REFERENCE TO RELATED APPLICATION

This application claims priority of Korean patent application number 10-2008-0040930, filed on Apr. 30, 2008, which is incorporated by reference in its entirety.

BACKGROUND OF THE INVENTION

The subject matter relates to a semiconductor design technology, and in particular, to a method for driving a received data in a semiconductor memory device. More particularly, this application relates to a method for driving a received data at a variable data input/output bandwidth in a semiconductor memory device.

Generally, in a semiconductor memory device such as a dynamic random access memory (DRAM), a data input/output bandwidth represents the amount of data that can be simultaneously read or written by one addressing. The data input/output bandwidth makes it possible to perform more efficient operations by controlling the amount of data input/output according to the use purposes of the DRAM. For example, a DRAM used as a main memory might have an X8 data input/output bandwidth, whereas a DRAM used in a graphic card might have an X32 data input/output bandwidth.

Moreover, the data input/output bandwidth corresponds to the number of data input/output pads for the DRAM. For examples the DRAM for the main memory having the X8 data input/output bandwidth has eight data input/output pads, whereas the DRAM for the graphic card having the X32 data input/output bandwidth has thirty-two data input/output pads.

In the case of the DRAM used as the main memory, the data input/output bandwidth may be determined according to whether the DRAM is used in a personal computer (PC) which processes a relatively small amount of data or a server which processes a relatively large amount of data. In one example, a DRAM used in a notebook computer has the X4 data input/output bandwidth, a DRAM used in a desktop computer has the X8 data input/output bandwidth, and a DRAM used in a server has an X16 data input/output bandwidth.

In this way, as the DRAM is used as the main memory, since DRAMs having the same purpose also have a variable data input/output bandwidth, the DRAM used in the main memory is designed to selectively use the X4 data input/output bandwidth, the X8 data input/output bandwidth, and the X16 data input/output bandwidth.

That is, a DRAM is designed which uses the X16 data input/output bandwidth having the sixteen data input/output pads, and this DRAM using the X16 data input/output bandwidth can also be controlled to use only eight or four data input/output pads among the sixteen data input/output pads according to a user's selection, i.e., data input/output option, thereby enabling the DRAM with the X16 data input/output bandwidth to use the X4 data input/output bandwidth and the X8 data input/output bandwidth.

The DRAM used as the main memory can easily change the data input/output bandwidth according to the user's selection, as described above, because the DRAM used as the main memory has the following structure.

FIG. 1 is a block diagram showing a conventional DRAM structure for a main memory.

Referring to FIG. 1, a conventional DRAM for a main memory includes a plurality of banks BANK0 through BANK3, global input/output line GIO (with sixteen lines) connected to the banks BANK0, BANK1, BANK2 and BANK3 to input and output data, and sixteen data input/output pads DQ0 through DQ15 corresponding to the sixteen lines in global input/output line GIO.

Since the conventional DRAM for the main memory has a structure that all the banks BANK0 through BANK3 are connected to all the data input/output pads DQ0 through DQ15, all the sixteen data input/output pads DQ0 through DQ15 are used in the X16 data input/output bandwidth, only the eight data input/output pads DQ0 through DQ7 are used in the X8 data input/output bandwidth, and only the four data input/output pads DQ0 through DQ3 are used in the X4 data input/output bandwidth. Although the number of data input/output pads used in such a scheme is changed, it is not difficult to input external data to the banks BANK0 through BANK3 via the global input/output line GIO or to output data stored in the banks BANK0 through BANK3.

In this way, the DRAM for the main memory can change the data input/output bandwidth according to a user's selection, whereas a DRAM for a graphics device uses a fixed X32 data input/output bandwidth. This is because the DRAM for the graphics device requires inputting/outputting data at far faster speed than the DRAM for the main memory so that it must have the following structure.

FIG. 2 is a block diagram illustrating a conventional DRAM structure for a graphics device.

Referring to FIG. 2, a conventional DRAM for a graphics device includes a plurality of bank groups 200A through 200D each including a plurality of banks BANK0 through BANK15, a plurality of data input/output pads DQ0 through DQ31 in four groups of eight for respectively receiving data by the bank groups 200A through 200D, and four global input/output lines GIO_UL (with 8 lines), GIO_DL (with 8 lines), GIO_DR (with 8 lines) and GIO_UR (with 8 lines) respectively inputting/outputting data between the bank groups 200A through 200D and four data input/output pad groups 260A through 260D.

As shown in FIG. 2, the data input/output pads DQ0 through DQ31 are divided into the data input/output pad group 260A corresponding to the zeroth bank group 200A, the data input/output pad group 260B corresponding to the first bank group 200B, the data input/output pad group 260C corresponding to the second bank group 200C, and the data input/output pad group 260D corresponding to the third bank group 200D.

The four global input/output lines GIO_UL, GIO_DL, GIO_UR, and GIO_DR are divided into the eight lines of zeroth global input/output line GIO_UL for inputting/outputting data of the zeroth bank group 200A, the eight lines of first global input/output line GIO_DL for inputting/outputting data of the first bank group 200B, the eight lines of second global input/output line GIO_DR for inputting/outputting data of the second bank group 200C, and the eight lines of third global input/output line GIO_UR for inputting/outputting data of the third bank group 200D.

From the structure of the DRAM for the graphics device described above, it can be seen that none of the bank groups 200A, 200B, 200C and 200D is connected to all of the data input/output pads DQ0 through DQ31. That is, the zeroth bank group 200A can input/output data through only the data input/output pad group 260A including the zeroth to seventh data input/output pads DQ0 through DQ7. The first bank group 200B can input/output data through only the data input/output pad group 260B including the eighth to fifteenth data input/output pads DQ8 through DQ15. The second bank group 200C can input/output data through only the data input/output pad group 260C including the sixteenth to twenty-third data input/output pads DQ16 through DQ23. The third bank group 200D can input/output data through only the data input/output pad group 260D including the twenty-fourth to thirty-first data input/output pads DQ24 through DQ31.

Accordingly, in a state where the data input/output bandwidth is changed into the X16 data input/output bandwidth, the second and third bank groups 200C and 200D cannot input/output data, as only the sixteen data input/output pads DQ0 through DQ15 are used.

To provide access to each of the bank groups, even in a case where the number of the data input/output pads for inputting/outputting data is reduced by the change of the data input/output bandwidth, the structure of the DRAM for the graphics device capable of inputting/outputting with all internal banks has been proposed as follows.

FIG. 3 is a block diagram showing a structure of a conventional DRAM for a graphics device, capable of easily changing a data input/output bandwidth.

Referring to FIG. 3, a conventional DRAM for a graphics device capable of changing a data input/output bandwidth includes a plurality of bank groups 300A, 300B, 300C and 300D each including a plurality of banks BANK0 through BANK15, a plurality of data input/output pads DQ0 through DQ31 grouped by a predetermined number for receiving data by each of the bank groups 300A through 300D, first driving units 320A and 320C driving data D0 through D7 and D16 through D23 input through first pad groups 360A and 360C to transfer the data to the first and third bank groups 300A and 300C corresponding to the first pad groups 360A and 360C, second driving units 320B and 320D driving data D8 through D15 and D24 through D31 input through second pad groups 360B and 360D to transfer the data to the second and fourth bank groups 300B and 300D corresponding to the second pad groups 360B and 360D, and data division transferring units 340A and 340B transferring data D0 through D7 and D16 through D23 input through the first pad groups 360A and 360C to the first and third bank groups 300A and 300C corresponding to the first pad groups 360A and 360C and the second and fourth bank groups 300B and 300D corresponding to the second pad groups 360B and 360D.

Moreover, the conventional DRAM for the graphics device further includes first data transferring units 380A and 380C transferring any one of the output data D0 through D7 and D16 through D23 of the first driving units 320A and 320C and the output data D0, D1, D2, D3, D4, D5, D6, D7, D16, D17, D18, D19, D20, D21, D22 and D23 of the data division transferring units 340A and 340B to the first and third bank groups 300A and 300C corresponding to the first pad groups 360A and 360C in response to an address signal ADDRESS, and second data transferring units 380B and 380D transferring any one of the output data D8, D9, D10, D11, D12, D13, D14, D15, D24, D25, D26, D27, D28, D29, D30 and D31 of the second driving units 320B and 320D and the output data D8, D9, D10, D11, D12, D13, D14, D15, D24, D25, D26, D27, D28, D29, D30 and D31 of the data division transferring units 340A and 340B to the second and fourth bank groups 300B and 300D corresponding to the second pad groups 360B and 360D in response to the address signal ADDRESS.

At this point, the data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31 are divided into the pad group 360A corresponding to the zeroth bank group 300A, the pad group 360B corresponding to the first bank group 300B, the pad group 360C corresponding to the second bank group 300C, and the pad group 360D corresponding to the third bank group 300D. The pad groups 360A, 360B, 360C and 360D are divided into the first pad groups 360A and 360C, which receive external data regardless of the data input/output bandwidth, and the second pad groups 360B and 360D, which selectively receive data according to the data input/output bandwidth of a semiconductor device.

According to the above-described configuration, in the conventional DRAM for the graphics device capable of changing a data input/output bandwidth, in the operation of the X16 data input/output bandwidth, it can be seen that data are input through the zeroth to seventh data input/output pads DQ0, DQ1, DQ2, DQ3, DQ4, DQ5, DQ6 and DQ7 and the sixteenth to twenty-third data input/output pads DQ16, DQ17, DQ18, DQ19, DQ20, DQ21, DQ22 and DQ23 included in the first pad groups 360A and 360C whereas data are not input through the eighth to fifteenth data input/output pads DQ8, DQ9, DQ10, DQ11, DQ12, DQ13, DQ14, DQ15 and the twenty-fourth to thirty-first data input/output pads DQ24, DQ25, DQ26, DQ27, DQ28, DQ29, DQ30 and DQ31 included in the second pad groups 360B and 360D.

Alternatively, in the operation of the X32 data input/output bandwidth, it can be seen that data are input to all the data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31 included in the first pad groups 360A and 360C and the second pad groups 360B and 360D.

Accordingly, it can be seen that the first driving units 320A and 320C are turned on and drive data input through the first pad groups 360A and 360C, in the operation of the X16 data input/output bandwidth and the operation of the X32 data input/output bandwidth.

On the other hand, it can be seen that the second driving units 320B and 320D are turned off not to perform any operation because data are not input through the second pad groups 360B and 360D in the operation of the X16 data input/output bandwidth, whereas they are turned on and drive data input trough the second pad groups 360B and 360D because data are input through the second pad groups 360B and 360D in the operation of the X32 data input/output bandwidth.

Furthermore, the data division transferring units 340A and 340B simply transfer the data D0, D1, D2, D3, D4, D5, D6, D7, D16, D17, D18, D19, D20, D21, D22 and D23 input through the first pad groups 360A and 360C to the first and third bank groups 300A and 300C corresponding to the first pad groups 360A and 360C and the second and fourth bank groups 300B and 300D corresponding to the second pad groups 360B and 360D. Such a configuration will be described in more detail below.

FIG. 4 is a circuit diagram illustrating a detailed structure of a conventional DRAM for a graphic capable of easily changing a data input/output bandwidth illustrated in FIG. 3.

FIG. 4 illustrates connection relationships between the zeroth data input/output pad DQ0 included in the first pad groups 360A and 360C, the eighth data input/output pad DQ8 included in the second pad groups 360B and 360D, a zeroth driver DRV0 included in the first driving units 320A and 320C, an eighth driver DRV8 included in the second driving units 320B and 320D, a zeroth path PTH0 included in the data division transferring units 340A and 340B, a zeroth multiplexer MUX0 included in the first data transferring units 380A and 380C, an eighth multiplexer MUX8 included in the second data transferring units 380B and 380D, the zeroth bank group 300A, and the first bank group 300B, among the elements of the conventional DRAM for the graphics device capable of changing the data input/output bandwidth illustrated in FIG. 3.

In FIG. 4, for the convenience of the description, it is omitted to describe to connection relationships of the sixteenth driver DRV16, the sixteenth input/output pad DQ16 and the sixteenth and twenty fourth multiplexers MUX16 and MUX24 shown in FIG. 3, since the sixteenth driver DRV16, the sixteenth input/output pad DQ16 and the sixteenth and twenty fourth multiplexers MUX16 and MUX24 shown in FIG. 3 are corresponding to the zeroth driver DRV0, the zeroth input/output pad DQ0 and the zeroth and eighth multiplexers MUX0 and MUX8 shown in FIG. 3.

Referring to FIG. 4, among the elements of the conventional DRAM for the graphics device capable of changing the data input/output bandwidth illustrated in FIG. 3, the data division transferring units 340A and 340B simply receive the output data of the zeroth driver DRV0 included in the first driving units 320A and 320C and only transfer the zeroth multiplexer MUX0 included in the first data transferring units 380A and 380C and the eighth multiplexer MUX8 included in the second data transferring units 380B and 380D.

That is, when data are output from the zeroth driver DRV0 included in the first driving units 320A and 320C, the data division transferring units 340A and 340B unconditionally transfer the data to the zeroth multiplexer MUX0 included in the first data transferring units 380A and 380C and the eighth multiplexer MUX8 included in the second data transferring units 380B and 380D, and thus the data division transferring units 340A and 340B intend to transfer the output data of the zeroth driver DRV0 included in the first driving units 320A and 320C to the zeroth and first bank groups 300A and 300B.

At this point, in the operation of the X16 data input/output bandwidth, the zeroth multiplexer MUX0 included in the first data transferring units 380A and 380C and the eighth multiplexer MUX8 respectively perform control for the output data of the zeroth path PTH0 included in the data division transferring units 340A and 340B to be transferred to the zeroth bank group 300A or the first bank group 300B in response to the address signal ADDRESS. That is, the zeroth multiplexer MUX0 included in the first data transferring units 380A and 380C and the eighth multiplexer MUX8 respectively perform control for the output data of the zeroth driver DRV0 included in the first driving units 320A and 320C applied to the zeroth path PTH0 included in the data division transferring units 340A and 340B to be transferred the zeroth and first bank groups 300A and 300B.

Similarly, in the operation of the X32 data input/output bandwidth, the zeroth multiplexer MUX0 included in the first data transferring units 380A and 380C and the eighth multiplexer MUX8 respectively perform control for the output data of the zeroth driver DRV0 included in the first driving units 320A and 320C to be transferred to the zeroth bank group 300A and for the output data of the eighth driver DRV8 included in the driving units 320B and 320D to be transferred to the first bank group 300B in response to the address signal ADDRESS.

Additionally, the address signal ADDRESS, which determines whether the output data of the zeroth driver DRV0 is transferred to the zeroth bank group 300A or the first bank group 300B, is applied to an address input pad (not shown) simultaneously with the application of the data D0 of the zeroth data input/output pad DQ0.

Although the data division transferring units 340A and 340B operate with the above-described configuration, when the data input/output bandwidth is changed in the DRAM for the graphics device, data input through a predetermined data input/output pad may instead be driven to be transferred to all banks of the semiconductor memory device.

By the way, as illustrated in FIGS. 3 and 4, it can be seen that the data division transferring units 340A and 340B are disposed relatively near the first driving units 320A and 320C and the first data transferring units 380A and 380C, but is disposed relatively far from the second driving units 320B and 320D and the second data transferring units 380B and 380D.

That is, the first driving units 320A and 320C should transfer data input through the first pad groups 360A and 360C to the relatively near first data transferring units 380A and 380C, and should also transfer data input through the first pad groups 360A and 360C to the relatively far second data transferring units 380B and 380D. Accordingly, the driving power of the first driving units 320A and 320C is relatively strongly designed for the output data thereof to be stably transferred to the relatively far second data transferring units 380B and 380D.

On the other hand, since the second driving units 320B and 320D transfer data input through the second pad groups 360B and 360D to the relatively near second data transferring units 380B and 380D, the second driving units 320B and 320D are designed to have a relatively weak driving power.

In this way, in a case where the driving power of the first driving units 320A and 320C is relatively strongly designed, the driving power of the first driving units 320A and 320C can stably transfer the output data thereof to a far distance, but also consume a large amount of current in proportion to the transferring distance of the output data.

Particularly, in a case where the output data of the first driving units 320A and 320C should stably be transferred to the relatively far first bank group 300B as well as the relatively near zeroth bank group 300A like the operation of the X16 data input/output bandwidth, since it is preferential that data should stably be transferred, the driving power of the first driving units 320A and 320C may strongly be designed.

However, in a case where the output data of the first driving units 320A and 320C are transferred to only the relatively near zeroth bank group 300A and are not transferred to the relatively far first bank group 300B like the operation of the X32 data input/output bandwidth, there is no need that the driving power of the first driving units 320A and 320C is strongly designed.

By the way, the first driving units 320A and 320C have a strong driving power irrespective of the operation of the X16 data input/output bandwidth and the operation of the X32 data input/output bandwidth. Consequently, a current is consumed unnecessarily.

SUMMARY OF THE INVENTION

Embodiments of the present invention are directed to providing a DRAM for a graphics device which maintains the driving power of data input from a data input/output pad at a minimum corresponding to the data input/output bandwidth, for transferring the data to internal banks.

In accordance with an aspect of the present invention, there is provided a semiconductor memory device, including: a plurality of bank groups each comprising a plurality of banks; a plurality of data pads grouped by a predetermined number for receiving data for the bank groups, wherein the data pads are divided into a plurality of first pad groups receiving data and a plurality of second pad groups selectively receiving data according to a data input/output option value; a first driving unit configured to drive data input via the first pad group to transfer the data input via the first pad group to the bank group corresponding to the first pad group; a second driving unit configured to drive data input via the second pad group to transfer the data input via the second pad group to the bank group corresponding to the second pad group; and a third driving unit configured to drive data input via the first pad group to transfer the data input via the first pad group to the bank group corresponding to the second pad group in response to the data input/output option value.

In accordance with another aspect of the present invention, there is provided a semiconductor memory device, including: a plurality of bank groups each comprising a plurality of banks; a plurality of data pads grouped by a predetermined number for receiving data for each of the bank groups, wherein the data pads are divided into a plurality of first pad groups receiving data and a plurality of second pad groups selectively receiving data according to a data input/output option value; a plurality of pipe latches grouped by a predetermined number for latching data input via each data input/output pad, wherein the pipe latches are divided into a first pipe latch group latching data input via the first pad group and a second pipe latch group selectively latching data input via the first pad group or the second pad group in response to the data input/output option value; a first driving unit configured to drive data latched by the first pipe latch group to transfer the data latched by the first pipe latch group to the bank group corresponding to the first pad group; a second driving unit configured to drive data latched by the second pipe latch group to transfer the data latched by the second pipe latch group to the bank group corresponding to the second pad group; and a data transferring unit configured to transfer data input via the first pad group or the second pad group to the second pipe latch group in response to the data input/output option value.

DETAILED DESCRIPTION

Hereinafter, embodiments of the present invention will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

First Embodiment

Figure 1:
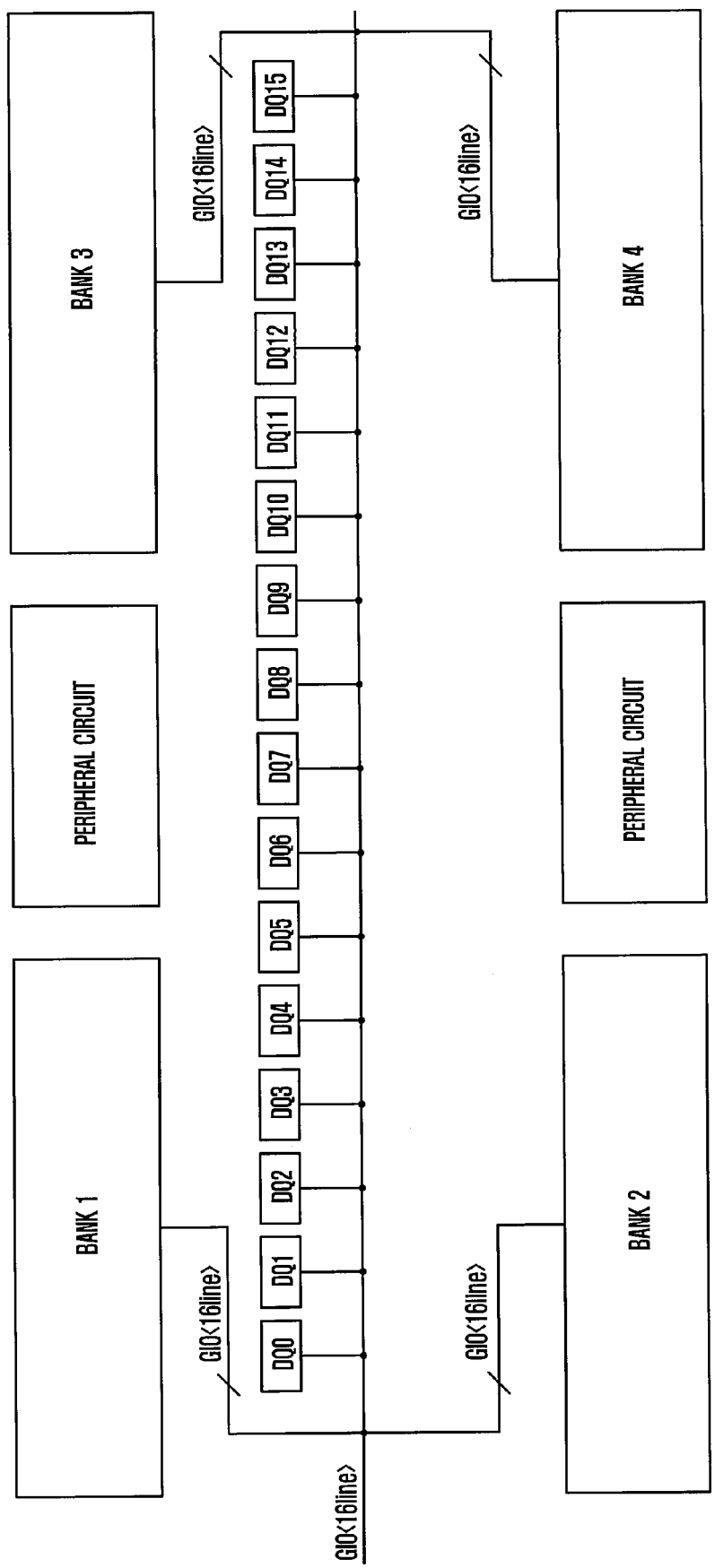
FIG. 1 is a block diagram showing a conventional DRAM structure for a main memory.
Figure 2:
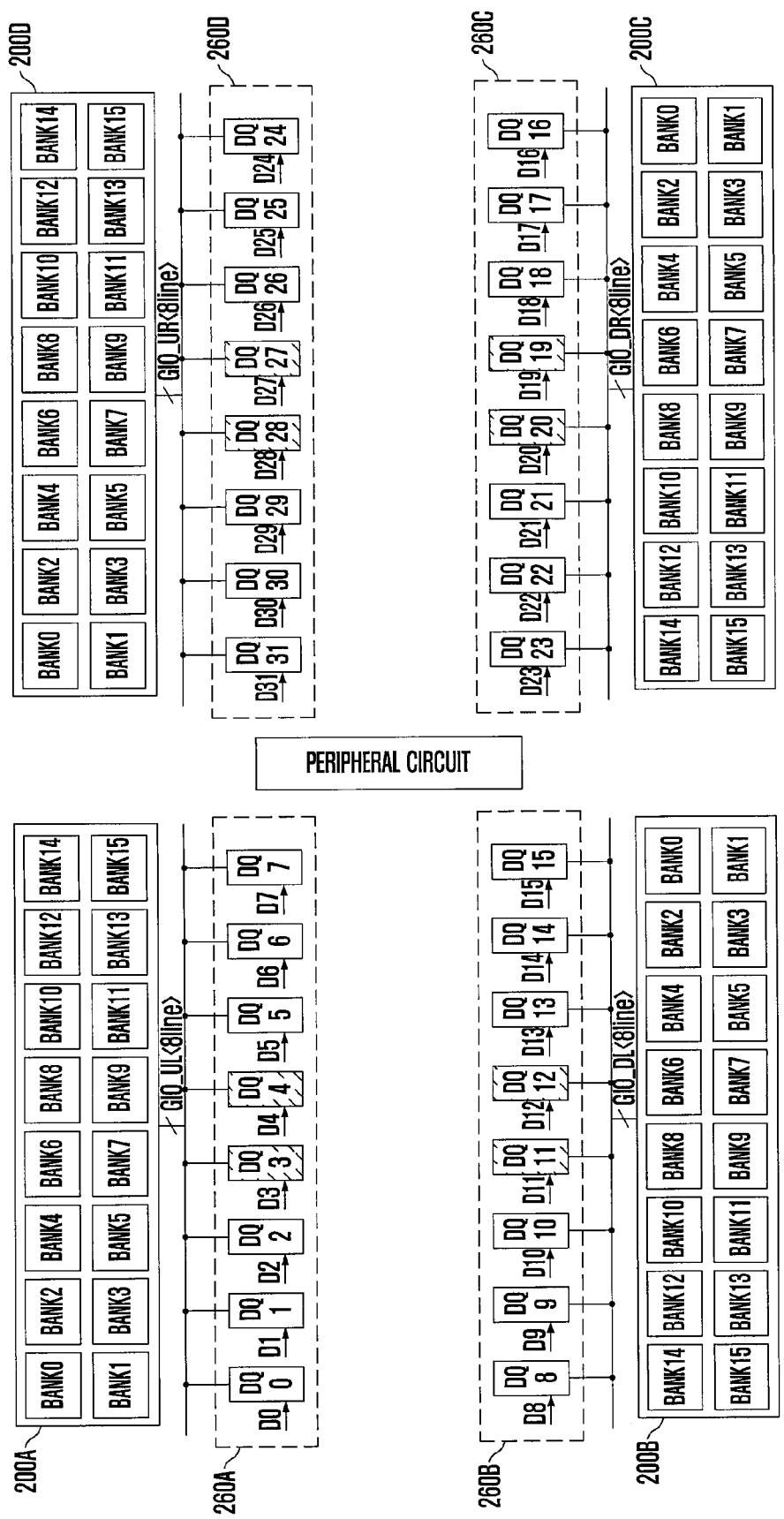
FIG. 2 is a block diagram showing a conventional DRAM structure for a graphic.
Figure 3:
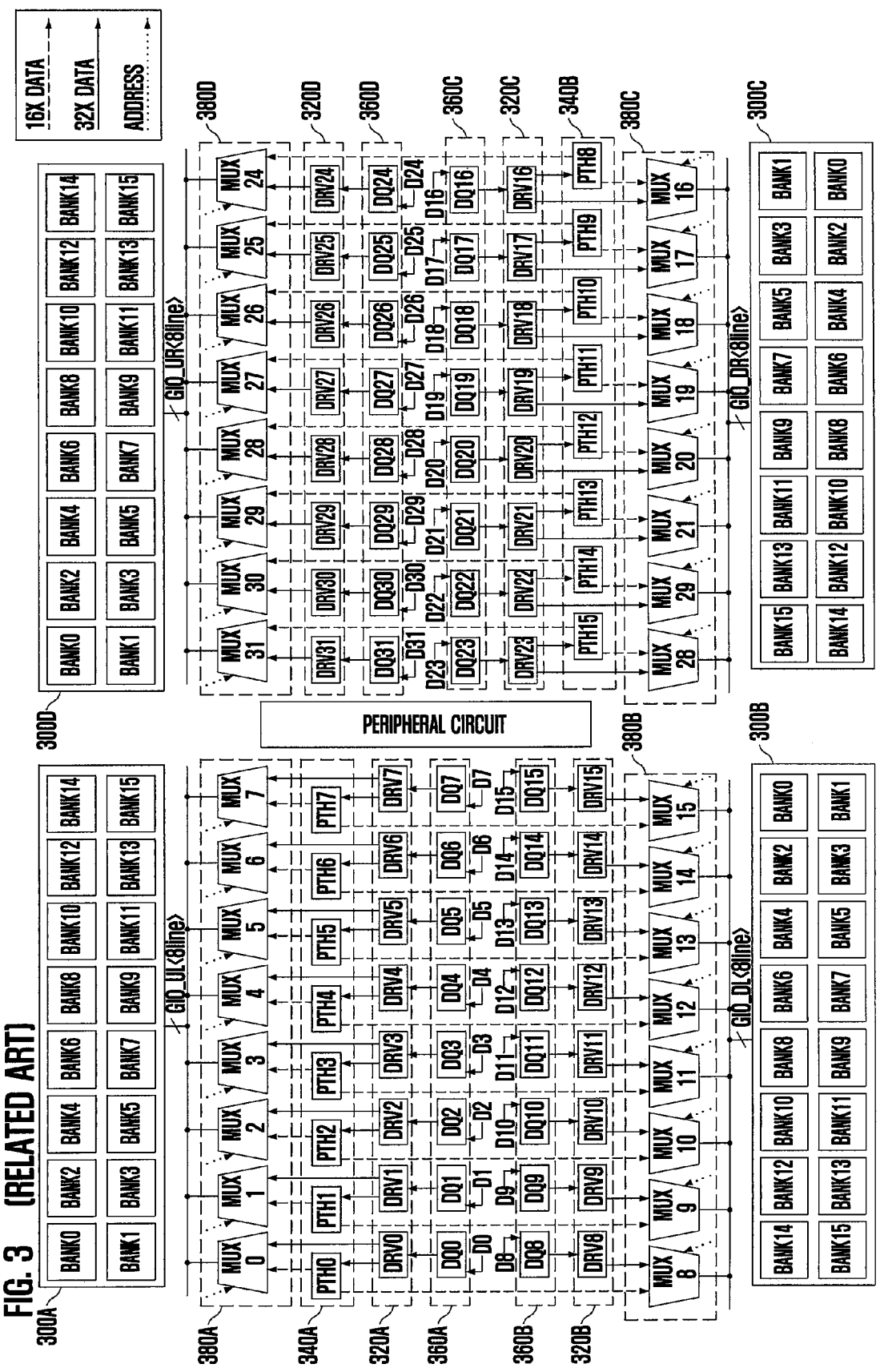
FIG. 3 is a block diagram showing a structure of a conventional DRAM for a graphics device capable of changing a data input/output bandwidth.
Figure 4:
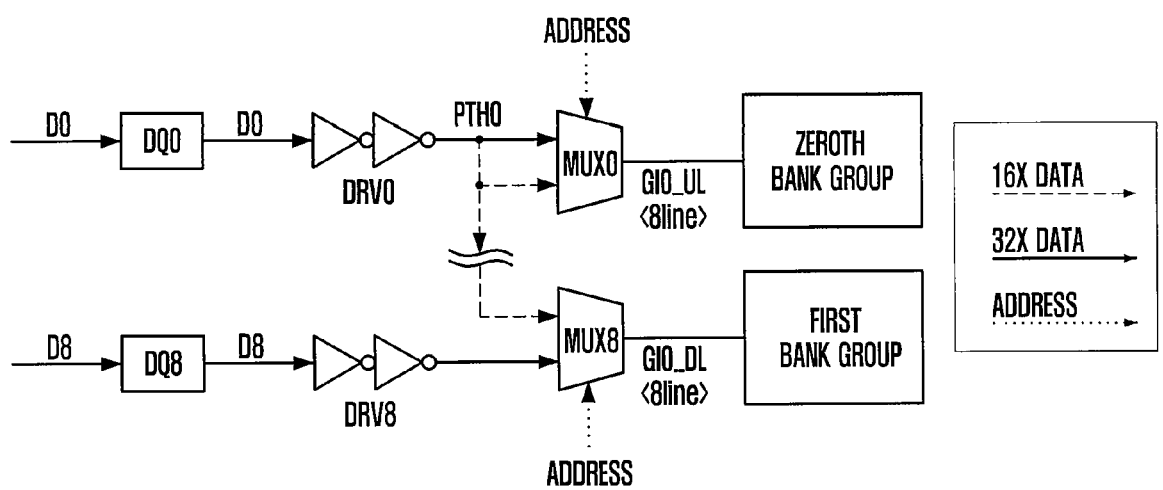
FIG. 4 is a circuit diagram showing a detailed structure of a conventional DRAM for a graphics device capable of changing a data input/output bandwidth illustrated in FIG. 3.
Figure 5:
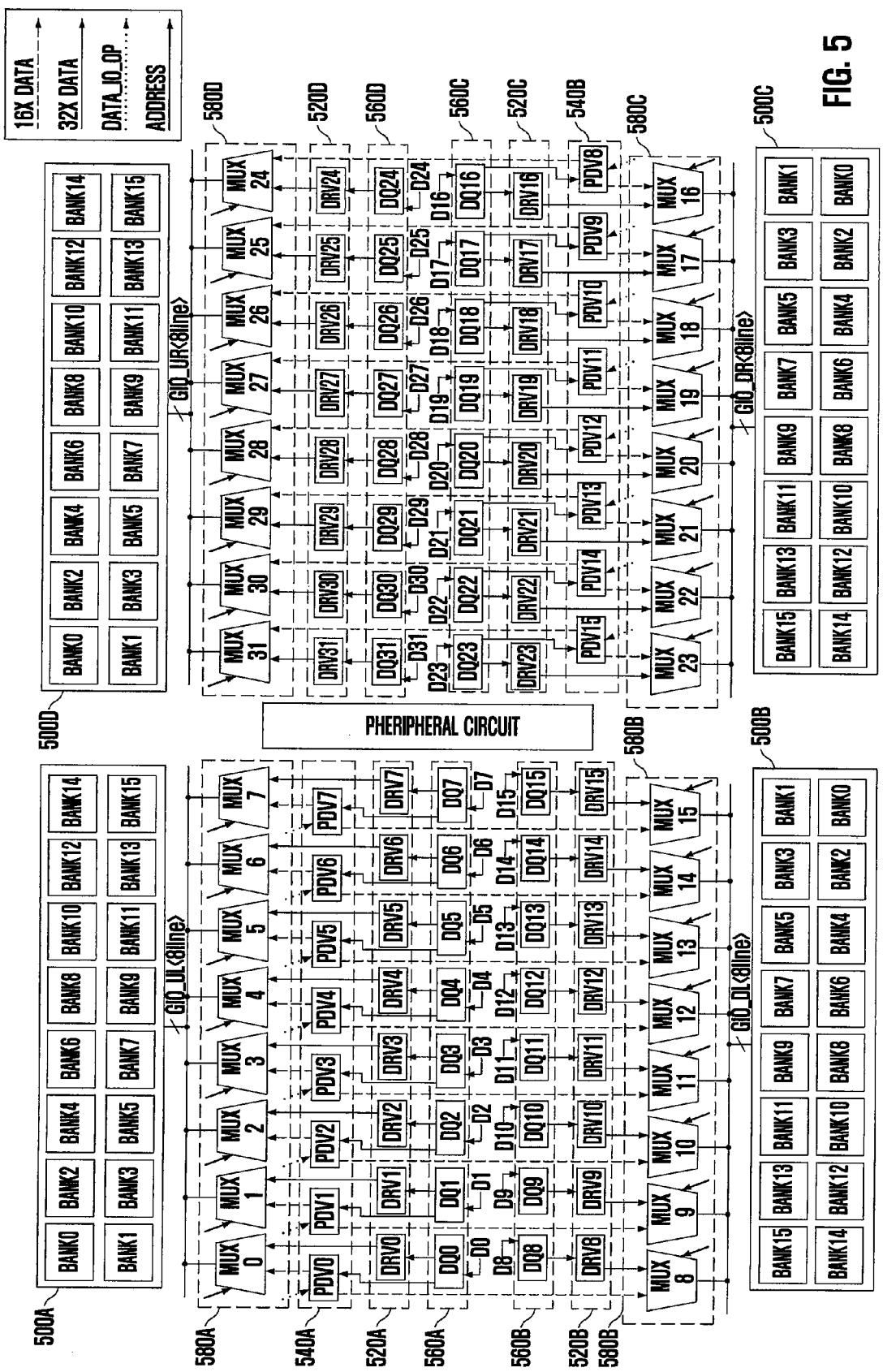
FIG. 5 is a block diagram illustrating the structure of a DRAM for a graphics device capable of changing a data input/output bandwidth in accordance with a first embodiment of the present invention.

FIG. 5 is a block diagram illustrating the structure of a DRAM for a graphics device capable of easily changing a data input/output bandwidth in accordance with a first embodiment of the present invention.

Referring to FIG. 5, a DRAM for a graphics device capable of easily changing data input/output bandwidth in accordance with a first embodiment of the present invention includes a plurality of bank groups 500A, 500B, 500C and 500D each including a plurality of banks BANK0, BANK1, BANK2, BANK3, BANK4, BANK5, BANK6, BANK7, BANK8, BANK9, BANK10, BANK11, BANK12, BANK13, BANK14 and BANK15, a plurality of data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31 grouped by a predetermined number for receiving data into the bank groups 500A, 500B, 500C and 500D, first driving units 520A and 520C driving data D0, D1, D2, D3, D4, D5, D6, D7, D16, D17, D18, D19, D20, D21, D22 and D23 input through first pad groups 560A and 560C to transfer the data to the first and third bank groups 500A and 500C corresponding to the first pad groups 560A and 560C, second driving units 520B and 520D driving data D8, D9, D10, D11, D12, D13, D14, D15, D24, D25, D26, D27, D28, D29, D30 and D31 input through second pad groups 560B and 560D to transfer the data to the second and fourth bank groups 500B and 500D corresponding to the second pad groups 560B and 560D, and third driving units 540A and 540B driving data D0, D1, D2, D3, D4, D5, D6, D7, D16, D17, D18, D19, D20, D21, D22 and D23 input through first pad groups 560A and 560C to transfer them to the second and fourth bank groups 500B and 500D corresponding to the second pad groups 560B and 560D according to a data input/output option value DATA_IO_OP.

Moreover, the DRAM for the graphics device in accordance with the first embodiment of the present invention further includes first data transferring units 580A and 580C transferring any one of the output data D0, D1, D2, D3, D4, D5, D6, D7, D16, D17, D18, D19, D20, D21, D22 and D23 of the first driving units 520A and 520C and the output data D0, D1, D2, D3, D4, D5, D6, D7, D16, D17, D18, D19, D20, D21, D22 and D23 of the third driving units 540A and 540B to the first and third bank groups 500A and 500C corresponding to the first pad groups 560A and 560C in response to an address signal ADDRESS, and second data transferring units 580B and 580D transferring any one of the output data D8, D9, D10, D11, D12, D13, D14, D15, D24, D25, D26, D27, D28, D29, D30 and D31 of the second driving units 520B and 520D and the output data D8, D9, D10, D11, D12, D13, D14, D15, D24, D25, D26, D27, D28, D29, D30 and D31 of the third driving units 540A and 540B to the second and fourth bank groups 500B and 500D corresponding to the second pad groups 560B and 560D in response to the address signal ADDRESS.

At this point, the data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31 are divided into the pad group 560A corresponding to the zeroth bank group 500A, the pad group 560B corresponding to the first bank group 500B, the pad group 560C corresponding to the second bank group 500C, and the pad group 560D corresponding to the third bank group 500D. The pad groups 560A, 560B, 560C and 560D are divided into the first pad groups 560A and 560C receiving external data regardless of the data input/output bandwidth and the second pad groups 560B and 560D selectively receiving data according to the data input/output bandwidth.

According to the above-described configuration, in the DRAM for the graphics device in accordance with the first embodiment of the present invention, in the operation of the X16 data input/output bandwidth, it can be seen that data are input through the zeroth to seventh data input/output pads DQ0, DQ1, DQ2, DQ3, DQ4, DQ5, DQ6 and DQ7 and the sixteenth to twenty-third data input/output pads DQ16, DQ17, DQ18, DQ19, DQ20, DQ21, DQ22 and DQ23 included in the first pad groups 560A and 560C, whereas data are not input through the eighth to fifteenth data input/output pads DQ8, DQ9, DQ10, DQ11, DQ12, DQ13, DQ14, DQ15 and the twenty-fourth to thirty-first data input/output pads DQ24, DQ25, DQ26, DQ27, DQ28, DQ29, DQ30 and DQ31 included in the second pad groups 560B and 560D.

Alternatively, in the operation of the X32 data input/output bandwidth, it can be seen that data are input to all the data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31 included in the first pad groups 560A and 560C and the second pad groups 560B and 560D.

Accordingly, it can be seen that the first driving units 520A and 520C are turned on and drive data input through the first pad groups 560A and 560C, in the operation of the X16 data input/output bandwidth and the operation of the X32 data input/output bandwidth.

On the other hand, it can be seen that the second driving units 520B and 520D are turned off not to perform any operation because data are not input through the second pad groups 560B and 560D in the operation of the X16 data input/output bandwidth, whereas they are turned on and drive data input trough the second pad groups 560B and 560D because data are input through the second pad groups 560B and 560D in the the operation of the X32 data input/output bandwidth.

Furthermore, it can be seen that the third driving units 540A and 540B are turned on and drive data input through the first pad groups 560A and 560C in a first selection mode of the data input/output option value DATA_IO_OP operating by the X16 data input/output bandwidth, and are turned off not to perform any operation in a second selection mode of the data input/output option value DATA_IO_OP operating by the X32 data input/output bandwidth.

Figure 6:
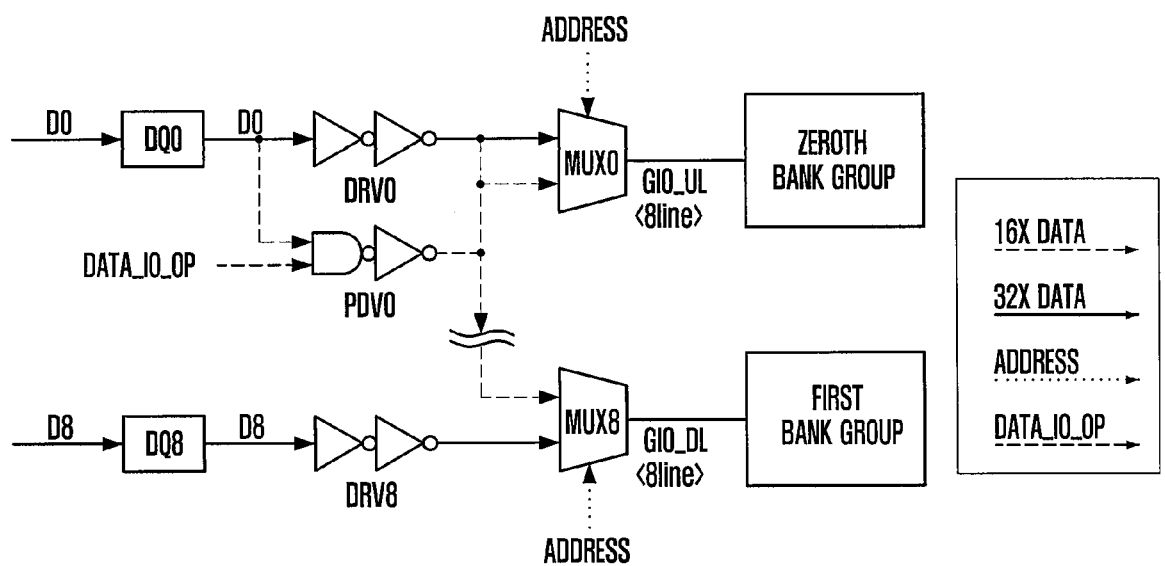
FIG. 6 is a circuit diagram illustrating a detailed structure of a DRAM for a graphics device capable of easily changing a data input/output bandwidth in accordance with a first embodiment of the present invention.

FIG. 6 is a circuit diagram illustrating a detailed structure of a DRAM for a graphics device capable of easily changing a data input/output bandwidth in accordance with a first embodiment of the present invention.

FIG. 6 illustrates connection relationships between the zeroth data input/output pad DQ0 included in the first pad groups 560A and 560C, the eighth data input/output pad DQ8 included in the second pad groups 560B and 560D, a zeroth driver DRV0 included in the first driving units 520A and 520C, an eighth driver DRV8 included in the second driving units 520B and 520D, a zeroth pass driver PDV0 included in the third driving units 540A and 540B, a zeroth multiplexer MUX0 included in the first data transferring units 580A and 580C, an eighth multiplexer MUX8 included in the second data transferring units 580B and 580D, the zeroth bank group 500A, and the first bank group 500B, among the elements of the DRAM for the graphics device capable of easily changing the data input/output bandwidth in accordance with the first embodiment of the present invention illustrated in FIG. 5.

In FIG. 6, for the convenience of the description, it is omitted to describe to connection relationships of the sixteenth and twenty fourth input/output pads DQ16 and DQ24 shown in FIG. 5, since the sixteenth and twenty fourth input/output pads DQ16 and DQ24 shown in FIG. 5 are corresponding to the zeroth and eighth input/output pads DQ0 and DQ8 shown in FIG. 5.

Referring to FIG. 6, it can be seen that the zeroth driver DRV0 included in the first driving units 520A and 520C is turned on in both the operation of the X16 data input/output bandwidth and the operation of the X32 data input/output bandwidth so that data are input through the zeroth data input/output pad DQ0 included in the first pad groups 560A and 560B, thereby driving data input through the zeroth data input/output pad DQ0 included in the first pad groups 560A and 560B.

Furthermore, it can be seen that the eighth driver DRV8 included in the second driving units 520B and 520D is turned off not to perform any operation because data are not input through the eighth data input/output pad DQ8 included in the second pad groups 560B and 560D in the operation of the X16 data input/output bandwidth, whereas it is turned on and drives data input trough the eighth data input/output pad DQ8 included in the second pad groups 560B and 560D because data are input through the eighth data input/output pad DQ8 included in the second pad groups 560B and 560D in the operation of the X32 data input/output bandwidth.

It can be seen that the zeroth pass driver PDV0 included in the third driving units 540A and 540B is turned on and drives data input through the zeroth data input/output pad DQ0 included in the first pad groups 560A and 560B in the first selection mode of the data input/output option value DATA_IO_OP operating by the X16 data input/output bandwidth, whereas it is turned off not to perform any operation according to the data input/output option value DATA_IO_OP in the second selection mode of the data input/output option value DATA_IO_OP operating by the X32 data input/output bandwidth.

That is, the first driving units 520A and 520C and the second driving units 520B and 520D respectively operates to drive data input through the first pad groups 560A and 560C and data input through the second pad groups 560B and 560D in the operation of the X16 data input/output bandwidth, and the first driving units 520A and 520C and the third driving units 540A and 540B respectively operates to drive only data input through the first pad groups 560A and 560C in the operation of the X32 data input/output bandwidth.

At this point, since the first driving units 520A and 520C and the second driving units 520B and 520D are designed to have a relatively weak driving power and the third driving units 540A and 540B are designed to have a relatively strong driving power, a level of a used driving power is changed according to whether an operation is the operation of the X32 data input/output bandwidth or the operation of the X16 data input/output bandwidth.

That is, in the first selection mode of the data input/output option value DATA_IO_OP operating by the X16 data input/output bandwidth, since the third driving units 540A and 540B having a relatively strong driving power are used, a relatively high current is consumed. In the second selection mode of the data input/output option value DATA_IO_OP operating by the X32 data input/output bandwidth, since the first driving units 520A and 520C and the second driving units 520B and 520D having a relatively weak driving power are used, a relatively low current is consumed. Therefore, an amount of current consumed in the first to third driving units 520A, 520B, 520C, 520D, 540A and 540B is changed according to whether the data input/output option value DATA_IO_OP is the first selection mode or the second selection mode.

In a case where the first embodiment of the present invention is applied as described above, the DRAM for the graphics device capable of changing the data input/output bandwidth includes the data driving units which can drive data input through the data input/output pads by a driving power corresponding to the data input/output option value DATA_IO_OP to transfer the data to the internal banks, thereby driving the data input through the data input/output pads by consuming a minimum amount of current regardless of the change of the data input/output bandwidth.

Second Embodiment

Figure 7:
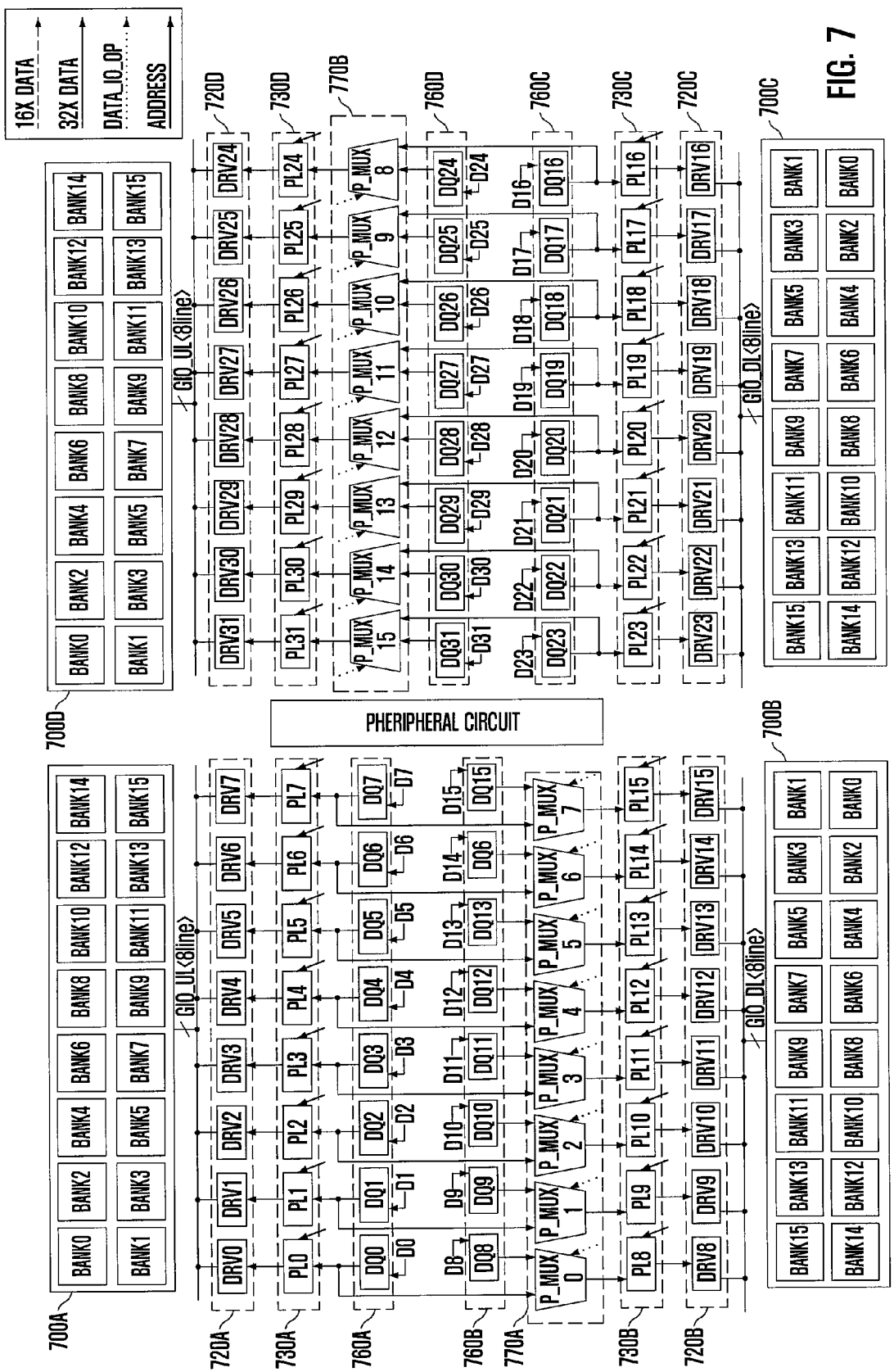
FIG. 7 is a block diagram illustrating the structure of a DRAM for a graphics device capable of easily changing a data input/output bandwidth in accordance with a second embodiment of the present invention.

FIG. 7 is a block diagram illustrating the structure of a DRAM for a graphics device capable of easily changing a data input/output bandwidth in accordance with a second embodiment of the present invention.

Referring to FIG. 7, a DRAM for a graphic capable of easily changing data input/output bandwidth in accordance with a second embodiment of the present invention includes a plurality of bank groups 700A, 700B, 700C and 700D each including a plurality of banks BANK0, BANK1, BANK2, BANK3, BANK4, BANK5, BANK6, BANK7, BANK8, BANK9, BANK10 BANK11, BANK12, BANK13, BANK14 and BANK15, a plurality of data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31 grouped by a predetermined number for receiving data into the bank groups 700A, 700B, 700C and 700D, a plurality of pipe latches PL0, PL1, PL2, PL3, PL4, PL5, PL6, PL7, PL8, PL9, PL10, PL11, PL12, PL13, PL14, PL15, PL16, PL17, PL18, PL19, PL20, PL21, PL22, PL23, PL24, PL25, PL26, PL27, PL28, PL29, PL30 and PL31 grouped by a predetermined number for latching the data D0, D1, D2, D3, D4, D5, D6, D7, D8, D9, D10, D11, D12, D13, D14, D15, D16, D17, D18, D19, D20, D21, D22, D23, D24, D25, D26, D27, D28, D29, D30 and D31 input through each of the data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31, first driving units 720A and 720C driving the data D0, D1, D2, D3, D4, D5, D6, D7, D16, D17, D18, D19, D20, D21, D22 and D23 latched by first pipe latch groups 730A and 730C to transfer the data to the first and third bank groups 700A and 700C corresponding to the first pad groups 760A and 760C, second driving units 720B and 720D driving the data D0, D1, D2, D3, D4, D5, D6, D7, D8, D9, D10, D11, D12, D13, D14, D15, D16, D17, D18, D19, D20, D21, D22, D23, D24, D25, D26, D27, D28, D29, D30 and D31 latched by second pipe latch groups 730B and 730D to transfer the data to the second and fourth bank groups 700B and 700D corresponding to the second pad groups 760B and 760D, and data transferring units 770A and 770B the data D0, D1, D2, D3, D4, D5, D6, D7, D16, D17, D18, D19, D20, D21, D22 and D23 input through the first pad groups 760A and 760C or the data D8, D9, D10, D11, D12, D13, D14, D15, D24, D25, D26, D27, D28, D29, D30 and D31 input through the second pad groups 760B and 760D to transfer the data to the second pipe latch groups 730B and 730D according to the data input/output option value DATA_IO_OP.

At this point, the data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31 are divided into the pad group 760A corresponding to the zeroth bank group 700A, the pad group 760B corresponding to the first bank group 700B, the pad group 760C corresponding to the second bank group 700C, and the pad group 760D corresponding to the third bank group 700D. The pad groups 760A, 760B, 760C and 760D are divided into the first pad groups 760A and 760C receiving external data regardless of the data input/output bandwidth and the second pad groups 760B and 760D selectively receiving data according to the data input/output bandwidth.

According to the above-described configuration, in the DRAM for the graphics device in accordance with the second embodiment of the present invention, in the operation of the X16 data input/output bandwidth, it can be seen that data are input through the zeroth to seventh data input/output pads DQ0, DQ1, DQ2, DQ3, DQ4, DQ5, DQ6 and DQ7 and the sixteenth to twenty-third data input/output pads DQ16, DQ17, DQ18, DQ19, DQ20, DQ21, DQ22 and DQ23 included in the first pad groups 760A and 760C whereas data are not input through the eighth to fifteenth data input/output pads DQ8, DQ9, DQ10, DQ11, DQ12, DQ13, DQ14, DQ15 and the twenty-fourth to thirty-first data input/output pads DQ24, DQ25, DQ26, DQ27, DQ28, DQ29, DQ30 and DQ31 included in the second pad groups 760B and 760D.

Likewise, in the operation of the X32 data input/output bandwidth, it can be seen that data are input to all the data input/output pads DQ0, DQ1, DQ2, DQ3, DQ4, DQ5, DQ6, DQ7, DQ8, DQ9, DQ10, DQ11, DQ12, DQ13, DQ14, DQ15, DQ16, DQ17, DQ18, DQ19, DQ20, DQ21, DQ22, DQ23, DQ24, DQ25, DQ26, DQ27, DQ28, DQ29, DQ30 and DQ31 included in the first pad groups 760A and 760C and the second pad groups 760B and 760D.

In this state, the data D0, D1, D2, D3, D4, D5, D6, D7, D16, D17, D18, D19, D20, D21, D22 and D23 input through the zeroth to seventh data input/output pads DQ0, DQ1, DQ2, DQ3, DQ4, DQ5, DQ6 and DQ7 and the sixteenth to twenty-third data input/output pads DQ16, DQ17, DQ18, DQ19, DQ20, DQ21, DQ22 and DQ23 included in the first pad groups 760A and 760C are applied to the first input terminals of a plurality of multiplexers P_MUX_0, P_MUX_1, P_MUX_2, P_MUX_3, P_MUX_4, P_MUX_5, P_MUX_6, P_MUX_7, P_MUX_8, P_MUX_9, P_MUX_10, P_MUX_11, P_MUX_12, P_MUX_13, P_MUX_14 and P_MUX_15 included in the data transferring units 770A and 770B. The data D8, D9, D10, D11, D12, D13, D14, D15, D24, D25, D26, D27, D28, D29, D30 and D31 input through the eighth to fifteenth data input/output pads DQ8, DQ9, DQ10, DQ11, DQ12, DQ13, DQ14, DQ15 and the twenty-fourth to thirty-first data input/output pads DQ24, DQ25, DQ26, DQ27, DQ28, DQ29, DQ30 and DQ31 included in the second pad groups 760B and 760D are applied to the second input terminals of a plurality of multiplexers P_MUX_0, P_MUX_1, P_MUX_2, P_MUX_3, P_MUX_4, P_MUX_5, P_MUX_6, P_MUX_7, P_MUX_8, P_MUX_9, P_MUX_10, P_MUX_11, P_MUX_12, P_MUX_13, P_MUX_14 and P_MUX_15 included in the data transferring units 770A and 770B. The applied data D0, D1, D2, D3, D4, D5, D6, D7, D16, D17, D18, D19, D20, D21, D22 and D23, or the applied data D8, D9, D10, D11, D12, D13, D14, D15, D24, D25, D26, D27, D28, D29, D30 and D31 are selectively transferred to the second pipe latch groups 730B and 730D according to the data input/output option value DATA_IO_OP.

Accordingly, the data transferring units 770A and 770B transfer the data D0, D1, D2, D3, D4, D5, D6, D7, D16, D17, D18, D19, D20, D21, D22 and D23 of the first pad groups 760A and 760C applied to the first input terminals of the multiplexers to the second pipe latch groups 730B and 730D, in the first selection mode of the data input/output option value DATA_IO_OP operating by the X16 data input/output bandwidth. The data transferring units 770A and 770B transfer the data D8, D9, D10, D11, D12, D13, D14, D15, D24, D25, D26, D27, D28, D29, D30 and D31 of the second pad groups 760B and 760D applied to the second input terminals of the multiplexers to the second pipe latch groups 730B and 730D, in the second selection mode of the data input/output option value DATA_IO_OP operating by the X32 data input/output bandwidth.

Figure 8:
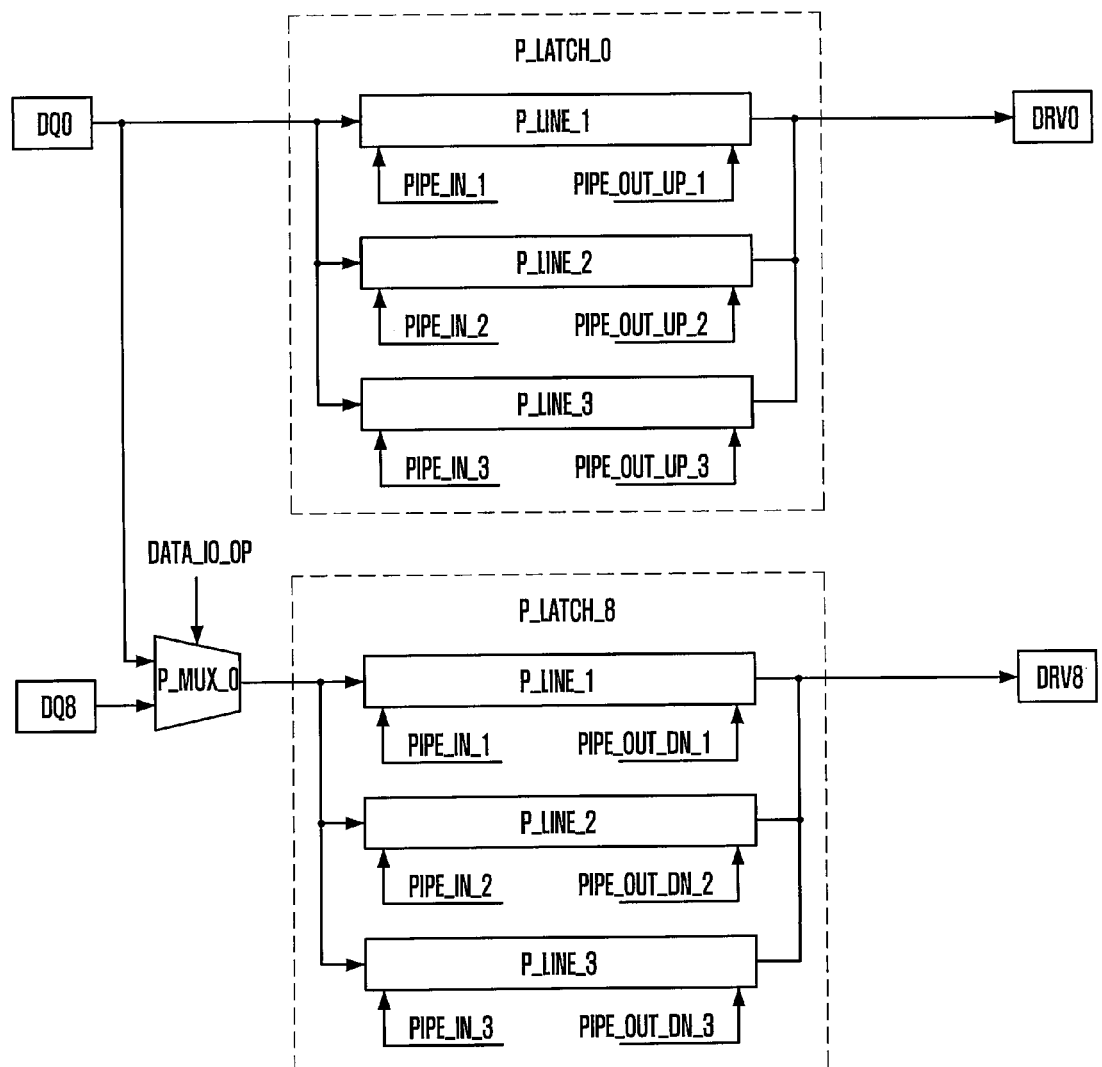
FIG. 8 is a circuit diagram illustrating a detailed structure of a DRAM for a graphics device capable of easily changing a data input/output bandwidth a second embodiment of the present invention illustrated in FIG. 7.

FIG. 8 is a circuit diagram illustrating a detailed structure of a DRAM for a graphic capable of easily changing a data input/output bandwidth in accordance with the second embodiment of the present invention illustrated in FIG. 7.

FIG. 8 illustrates connection relationships between the zeroth data input/output pad DQ0 included in the first pad groups 760A and 760C, a zeroth pipe latch PL0 included in the first pipe latch groups 730A and 730C, the eighth data input/output pad DQ8 included in the second pad groups 760B and 760D, an eighth pipe latch PL8 included in the second pipe latch groups 730B and 730D, and the zeroth multiplexer P_MUX_0 included in the data transferring units 770A and 770B.

In FIG. 8, for the convenience of the description, it will be omitted to describe to connection relationships of the sixteenth and twenty fourth pipe latches PL16 and PL24, the sixteenth input/output pad DQ16 and the sixteenth and twenty fourth multiplexers P_MUX16 and P_MUX24 shown in FIG. 7, since the sixteenth and twenty fourth pipe latches PL16 and PL24, the sixteenth input/output pad DQ16 and the sixteenth and twenty fourth multiplexers P_MUX16 and P_MUX24 shown in FIG. 7 are corresponding to the zeroth and eight pipe latches PL0 and PL8, the zeroth input/output pad DQ0 and the zeroth and eighth multiplexers P_MUX0 and P_MUX8 shown in FIG. 7.

Referring to FIG. 8, the zeroth data input/output pad DQ0 is directly connected to the input terminal of the zeroth pipe latch PL0 and is also connected to the first input terminal of the zeroth multiplexer P_MUX_0, the eighth data input/output pad DQ8 is connected to the second input terminal of the zeroth multiplexer P_MUX_0, and the output terminal of the zeroth multiplexer P_MUX_0 is connected to the input terminal of the eighth pipe latch PL8.

Herein, each of the zeroth pipe latch PL0 and the eighth pipe latch PL8 includes a plurality of pipelines P_LINE_1, P_LINE_2 and P_LINE_3. The pipelines P_LINE_1, P_LINE_2 and P_LINE_3 included in the zeroth pipe latch PL0 respectively receive the data of an input terminal thereof in response to a plurality of pipeline input signals PIPE_IN_1, PIPE_IN_2 and PIPE_IN_3, and respectively output the received data to the zeroth driver DRV0 included in the first driving units 720A and 720C in response to a plurality of first pipeline output signals PIPE_OUT_UP_1, PIPE_OUT_UP_2 and PIPE_OUT_UP_3.

The pipelines P_LINE_1, P_LINE_2 and P_LINE_3 included in the eighth pipe latch PL8 respectively receive the data of an input terminal thereof in response to the pipeline input signals PIPE_IN_1, PIPE_IN_2 and PIPE_IN_3, and respectively output the received data to the eighth driver DRV8 included in the second driving units 720B and 720D in response to a plurality of second pipeline output signals PIPE_OUT_DN_1, PIPE_OUT_DN_2 and PIPE_OUT_DN_3.

The zeroth multiplexer P_MUX_0 transfers one of the data D0 of the zeroth data input/output pad DQ0 applied through the first input terminal thereof and the data D8 of the eighth data input/output pad DQ8 applied through the second input terminal thereof to the input terminal of the eighth pipe latch PL8 in response to the data input/output option value DATA_IO_OP.

The DRAM in accordance with the second embodiment will be described below with reference to such a configuration.

First, the data D0 input to the zeroth data input/output pad DQ0 included in the first pad groups 760A and 760C is transferred to the zeroth pipe latch PL0 included in the first pipe latch groups 730A and 730C and are simultaneously transferred to the eighth pipe latch PL8 included in the second pipe latch groups 730B and 730D, in the first selection mode of the data input/output option value DATA_IO_OP operating by the X16 data input/output bandwidth.

That is, the zeroth multiplexer P_MUX_0 transfers the data D0 of the zeroth data input/output pad DQ0 applied through the first input terminal thereof to the eighth pipe latch PL8 in the second selection mode of the data input/output option value DATA_IO_OP operating by the X32 data input/output bandwidth.

In this way, the data D0 of the zeroth data input/output pad DQ0 transferred to each of the zeroth pipe latch PL0 and the eighth pipe latch PL8 is latched by any one of the pipelines P_LINE_1, P_LINE_2 and P_LINE_3 according to the pipeline input signals PIPE_IN_1, PIPE_IN_2 and PIPE_IN_3.

Additionally, since an 8-bit prefetch operation should be performed when the data D0 of the zeroth data input/output pad DQ0 is 8 bits, a capacity of the pipelines P_LINE_1, P_LINE_2 and P_LINE_3 included in each of the zeroth pipe latch PL0 and the eighth pipe latch PL8 also is 8 bits. Since an 4-bit prefetch operation should be performed when the data D0 of the zeroth data input/output pad DQ0 is 4 bits, a capacity of the pipelines P_LINE_1, P_LINE_2 and P_LINE_3 included in each of the zeroth pipe latch PL0 and the eighth pipe latch PL8 also is 4 bits.

In this way, the zeroth pipe latch PL0 and the eighth pipe latch PL8 latch the data D0 of the zeroth data input/output pad DQ0 at the same time. However, in a case where the first pipeline output signals PIPE_OUT_UP_1, PIPE_OUT_UP_2 and PIPE_OUT_UP_3 are toggled, the data latched by the zeroth pipe latch PL0 is output to the zeroth driver DRV0 included in the first driving units 720A and 720B and is transferred to the zeroth bank group 700A. In a case where the second pipeline output signals PIPE_OUT_DN_1, PIPE_OUT_DN_2 and PIPE_OUT_DN_3 are toggled, the data latched by the eighth pipe latch PL8 is output to the eighth driver DRV8 included in the second driving units 720B and 720D and is transferred to the third bank group 700C.

That is, in a case where a predetermined place in which the data D0 of the zeroth data input/output pad DQ0 should be stored is included in the zeroth bank group 700A, control is performed for the first pipeline output signals PIPE_OUT_UP_1, PIPE_OUT_UP_2 and PIPE_OUT_UP_3 to be toggled. In a case where the predetermined place in which the data D0 of the zeroth data input/output pad DQ0 should be stored is included in the third bank group 700C, control is performed for the second pipeline output signals PIPE_OUT_DN_1, PIPE_OUT_DN_2 and PIPE_OUT_DN_3 to be toggled.

Additionally, the predetermined place in which the data D0 of the zeroth data input/output pad DQ0 should be stored can be seen through the address signal ADDRESS applied to an address input pad (not shown) simultaneously with the application of the data D0 of the zeroth data input/output pad DQ0.

Accordingly, a circuit (not shown) for controlling the toggling of the first pipeline output signals PIPE_OUT_UP_1, PIPE_OUT_UP_2 and PIPE_OUT_UP_3 and the second pipeline output signals PIPE_OUT_DN_1, PIPE_OUT_DN_2 and PIPE_OUT_DN_3 operates in response to the address signal ADDRESS applied to the address input pad.

Furthermore, the data D0 input to the zeroth data input/output pad DQ0 included in the first pad groups 760A and 760C is transferred to the zeroth pipe latch PL0 included in the first pipe latch groups 730A and 730C, and the data D8 input to the eighth data input/output pad DQ8 included in the second pad groups 760B and 760D is transferred to the eighth pipe latch PL8 included in the second pipe latch groups 730B and 730D, in the second selection mode of the data input/output option value DATA_IO_OP operating by the X32 data input/output bandwidth.

That is, the zeroth multiplexer P_MUX_0 transfers the data D8 of the eighth data input/output pad DQ8 applied through the second input terminal thereof to the eighth pipe latch PL8, in the second selection mode of the data input/output option value DATA_IO_OP operating by the X32 data input/output bandwidth.

In this way, the data D0 of the zeroth data input/output pad DQ0 transferred to the zeroth pipe latch PL0 is latched by any one of the pipelines P_LINE_1, P_LINE_2 and P_LINE_3 included in the zeroth pipe latch PL0 according to the pipeline input signals PIPE_IN_1, PIPE_IN_2 and PIPE_IN_3, and the data D8 of the eighth data input/output pad DQ8 transferred to the eighth pipe latch PL8 is latched by any one of the pipelines P_LINE_1, P_LINE_2 and P_LINE_3 included in the eighth pipe latch PL8 according to the pipeline input signals PIPE_IN_1, PIPE_IN_2 and PIPE_IN_3.

In this way, the data D0 of the zeroth data input/output pad DQ0 latched by the zeroth pipe latch PL0 is transferred to the zeroth driver DRV0 included in the first driving units 720A and 720C according to the toggling of the first pipeline output signals PIPE_OUT_UP_1, PIPE_OUT_UP_2 and PIPE_OUT_UP_3.

Furthermore, the data D8 of the eighth data input/output pad DQ8 latched by the eighth pipe latch PL8 is output to the eighth driver DRV8 included in the second driving units 720B and 720D and is transferred to the third bank group 700C according to the toggling of the second pipeline output signals PIPE_OUT_DN_1, PIPE_OUT_DN_2 and PIPE_OUT_DN_3.

That is, in a case where the predetermined place in which the data D0 of the zeroth data input/output pad DQ0 should be stored is included in the zeroth bank group 700A, control is performed for the first pipeline output signals PIPE_OUT_UP_1, PIPE_OUT_UP_2 and PIPE_OUT_UP_3 to be toggled. In a case where the predetermined place in which the data D0 of the zeroth data input/output pad DQ0 should be stored is included in the third bank group 700C, control is performed for the second pipeline output signals PIPE_OUT_DN_1, PIPE_OUT_DN_2 and PIPE_OUT_DN_3 to be toggled.

In the structure of the DRAM for the graphics device capable of easily changing the data input/output bandwidth in accordance with the second embodiment having the above-described configuration, it can be seen that the first driving units 720A and 720C drive the data D0, D1, D2, D3, D4, D5, D6, D7, D16, D17, D18, D19, D20, D21, D22 and D23 latched by the first pipe latch groups 730A and 730C to transfer them to the first and third bank groups 700A and 700C corresponding to the first pad groups 760A and 760C, and are disposed relatively near the first and third bank groups 700A and 700C. Moreover, it can be seen that the second driving units 720B and 720D drive the data D0, D1, D2, D3, D4, D5, D6, D7, D8, D9, D10, D11, D12, D13, D14, D15, D16, D17, D18, D19, D20, D21, D22, D23, D24, D25, D26, D27, D28, D29, D30 and D31 latched by the second pipe latch groups 730B and 730D to transfer them to the second and fourth bank groups 700B and 700D corresponding to the second pad groups 760B and 760D, and are disposed relatively near the first and third bank groups 700A and 700C.

Accordingly, although the first driving units 720A and 720C and the second driving units 720B and 720D have a relatively weak driving power, they can stably transfer the data. Moreover, since the first driving units 720A and 720C and the second driving units 720B and 720D have a relatively weak driving power, they can consume only a low current.

In a case where the second embodiment is applied as described above, the DRAM for the graphics device capable of changing the data input/output bandwidth includes the pipe latches which can latch the data input through the data input/output pads, and transfers the selectively latched data to the internal banks according to the change of the data input/output bandwidth, thereby consuming a minimum amount of current regardless of the change of the data input/output bandwidth.

The DRAM for the graphics device capable of changing the data input/output bandwidth includes the data driving units which can drive data input through the data input/output pads by a driving power corresponding to the data input/output option value DATA_IO_OP to transfer the data to the internal banks, thereby consuming a minimum amount of current regardless of the change of the data input/output bandwidth.

The DRAM for the graphics device capable of changing the data input/output bandwidth includes the pipe latches which can latch data input through the data input/output pads, thereby consuming a minimum amount of current regardless of the change of the data input/output bandwidth.

While the present invention has been described with respect to the specific embodiments, it will be apparent to those skilled in the art that various changes and modifications may be made without departing from the spirit and scope of the invention as defined in the following claims.

For example, DRAMs for the graphics device in accordance with the embodiments of the present invention basically have the X32 data input/output bandwidth and may have the X16 data input/output bandwidth according to the change of the data input/output bandwidth, which is for convenience. That is, the spirit and scope of the present invention include a case where the DRAMs for the graphic have the data input/output bandwidth larger or smaller than the X32 data input/output bandwidth, and also include a case where the DRAMs for the graphic have the data input/output bandwidth larger or smaller than the X16 data input/output bandwidth according to the change of the data input/output bandwidth.

What is claimed is:

1. A semiconductor memory device, comprising:
a plurality of bank groups each comprising a plurality of banks;
a plurality of data pads grouped by a predetermined number for receiving data for the bank groups, wherein the data pads are divided into a plurality of first pad groups receiving data and a plurality of second pad groups selectively receiving data according to a data input/output option value;
a first driving unit configured to drive data input via the first pad group to transfer the data input via the first pad group to the bank group corresponding to the first pad group;
a second driving unit configured to drive data input via the second pad group to transfer the data input via the second pad group to the bank group corresponding to the second pad group; and
a third driving unit configured to drive data input via the first pad group to transfer the data input via the first pad group to the bank group corresponding to the second pad group in response to the data input/output option value.

2. The semiconductor memory device as recited in claim 1, further comprising:
a first data transferring unit configured to transfer one of an output data of the first driving unit and an output data of the third driving unit to the bank group corresponding to the first pad group in response to the data input/output option value; and
a second data transferring unit configured to transfer one of an output data of the second driving unit and an output data of the third driving unit to the bank group corresponding to the second pad group in response to the data input/output option value.

3. The semiconductor memory device as recited in claim 1, wherein data are input to the first pad group but are not input to the second pad group in a first selection mode of the data input/output option value, and data are input to both the first pad group and the second pad group in a second selection mode of the data input/output option value.

4. The semiconductor memory device as recited in claim 3, wherein the first driving unit is turned on and drives data input via the first pad group to transfer the data input via the first pad group to the bank group corresponding to the first pad group in the first selection mode and second selection mode of the data input/output option value.

5. The semiconductor memory device as recited in claim 3, wherein the second driving unit is turned off to not drive data in the first selection mode of the data input/output option value, and is turned on and drives data input via the second pad group to transfer the data input via the second pad group to the bank group corresponding to the second pad group in the second selection mode of the data input/output option value.

6. The semiconductor memory device as recited in claim 3, wherein the third driving unit is turned on and drives data input via the first pad group to transfer the data input via the first pad group to the bank group corresponding to the second pad group in the first selection mode of the data input/output option value, and is turned off to not transfer the data in the second selection mode of the data input/output option value.

7. The semiconductor memory device as recited in claim 1, wherein a driving power of the third driving unit is relatively higher than a driving power of either of the first and second driving units, and the first and second driving units have the same driving power.

8. The semiconductor memory device as recited in claim 3, wherein the amount of data input at a time in the second selection mode of the data input/output option value is twice the amount of data input at a time in the first selection mode of the data input/output option value.

9. A semiconductor memory device, comprising:
a plurality of bank groups each comprising a plurality of banks;
a plurality of data pads grouped by a predetermined number for receiving data for the bank groups, wherein the data pads are divided into a plurality of first pad groups receiving data and a plurality of second pad groups selectively receiving data according to a data input/output option value;
a plurality of pipe latches grouped by a predetermined number for latching data input via each data input/output pad, wherein the pipe latches are divided into a first pipe latch group latching data input via the first pad group and a second pipe latch group selectively latching data input via the first pad group or the second pad group in response to the data input/output option value;
a first driving unit configured to drive data latched by the first pipe latch group to transfer the data latched by the first pipe latch group to the bank group corresponding to the first pad group;
a second driving unit configured to drive data latched by the second pipe latch group to transfer the data latched by the second pipe latch group to the bank group corresponding to the second pad group; and
a data transferring unit configured to transfer data input via the first pad group or the second pad group to the second pipe latch group in response to the data input/output option value.

10. The semiconductor memory device as recited in claim 9, wherein data are input to the first pad group but are not input to the second pad group in a first selection mode of the data input/output option value, and data are input to both the first pad group and the second pad group in a second selection mode of the data input/output option value.

11. The semiconductor memory device as recited in claim 10, wherein the first driving unit drives data input via the first pad group to transfer the data input via the first pad group to the bank group corresponding to the first pad group in the first selection mode and second selection mode of the data input/output option value.

12. The semiconductor memory device as recited in claim 10, wherein the second driving unit drives data input via the first pad group to transfer the data input via the first pad group to the bank group corresponding to the second pad group in the first selection mode of the data input/output option value, and drives data input via the second pad group to transfer the data input via the second pad group to the bank group corresponding to the second pad group in the second selection mode of the data input/output option value.

13. The semiconductor memory device as recited in claim 10, wherein the data transferring unit drives data input via the first pad group to transfer the data input via the first pad group to the second pipe latch group in the first selection mode of the data input/output option value, and drives data input via the second pad group to transfer the data input via the second pad group to the second pipe latch group in the second selection mode of the data input/output option value.

14. The semiconductor memory device as recited in claim 10, wherein the amount of data input at a time in the second selection mode of the data input/output option value is twice the amount of data input at a time in the first selection mode of the data input/output option value.

* * * * *